United States Patent
Park

(10) Patent No.: US 9,087,554 B1
(45) Date of Patent: Jul. 21, 2015

(54) MEMORY DEVICE, METHOD FOR PERFORMING REFRESH OPERATION OF THE MEMORY DEVICE, AND SYSTEM INCLUDING THE SAME

(71) Applicant: Samsung Electronics Co., Ltd., Suwon-si (KR)

(72) Inventor: Chul-Woo Park, Yongin-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/103,402

(22) Filed: Dec. 11, 2013

Related U.S. Application Data

(60) Provisional application No. 61/740,706, filed on Dec. 21, 2012.

(51) Int. Cl.
*G11C 7/00* (2006.01)

(52) U.S. Cl.
CPC .......................................... *G11C 7/00* (2013.01)

(58) Field of Classification Search
CPC .. G11C 11/406; G11C 11/4076; G11C 29/02; G11C 11/4074; G11C 8/18
USPC ............................................ 365/185.25, 222
See application file for complete search history.

(56) References Cited

U.S. PATENT DOCUMENTS

| | | | |
|---|---|---|---|
| 5,644,545 A * | 7/1997 | Fisch | ............................ 365/222 |
| 5,777,921 A | 7/1998 | Takata et al. | |
| 8,009,498 B2 | 8/2011 | Chang et al. | |
| 2007/0033339 A1 | 2/2007 | Best et al. | |
| 2007/0070764 A1 | 3/2007 | Miyamoto et al. | |
| 2007/0183242 A1 | 8/2007 | Miyamoto | |
| 2008/0151669 A1 | 6/2008 | Bill et al. | |
| 2009/0161459 A1 | 6/2009 | Kohler et al. | |
| 2009/0190409 A1 | 7/2009 | Dittrich et al. | |
| 2011/0110175 A1 | 5/2011 | Chang et al. | |
| 2011/0122687 A1 | 5/2011 | Kwon et al. | |
| 2014/0095780 A1 * | 4/2014 | Bains et al. | ................... 711/105 |

FOREIGN PATENT DOCUMENTS

| | | |
|---|---|---|
| JP | 11-096755 | 4/1999 |
| KR | 10-0317195 | 5/2000 |
| KR | 10-2006-0054822 A | 5/2006 |
| KR | 10-2009-0129624 A | 12/2009 |
| KR | 10-2010-0076092 A | 7/2010 |
| KR | 10-2010-0124593 A | 11/2010 |
| KR | 10-2012-0059097 A | 6/2012 |
| KR | 10-1198251 | 7/2012 |
| KR | 10-2012-0131423 A | 12/2012 |

* cited by examiner

*Primary Examiner* — James G Norman
(74) *Attorney, Agent, or Firm* — Muir Patent Law, PLLC

(57) ABSTRACT

A method of performing a refresh operation of a memory device including a plurality of memory cells connected to a plurality of word lines. The method includes performing a table-based refresh operation on at least a first word line of the plurality of word lines in a first time period of a refresh cycle, and performing a detector-based refresh operation on at least a second word line of the plurality of word lines in a second time period of the refresh cycle. The first word line includes at least one memory cell predetermined to be a weak cell. The second word line includes at least one memory cell dynamically determined to be a weak cell.

16 Claims, 17 Drawing Sheets

MEMORY DEVICE, METHOD FOR PERFORMING REFRESH OPERATION OF THE MEMORY DEVICE, AND SYSTEM INCLUDING THE SAME

CROSS-REFERENCE TO RELATED APPLICATIONS

This application claims priority under 35 U.S.C. §119(e) to U.S. Provisional Patent Application No. 61/740,706 filed on Dec. 21, 2012, the disclosure of which is hereby incorporated by reference in its entirety.

BACKGROUND

This disclosure relates to a method of performing a refresh operation of a memory device, and more particularly to a memory device which may perform different types of refresh operations for same or different rows of the memory device, a method of performing a refresh operation of the memory device, and a system having the same.

The memory device may perform a refresh operation so as to prevent data stored in each of a plurality of memory cells included in the memory device from being lost by leakage. A cycle of a regular refresh operation periodically performed in the memory device is related to data retention time of a memory cell.

A refresh characteristic of a particular memory cell may be worse due to a specific operation of the memory device. Therefore, it is desirable to improve the refresh characteristic of the particular memory cell.

SUMMARY

An example embodiment of the present disclosure is directed to a method of performing a refresh operation of a memory device including a plurality of memory cells connected to a plurality of word lines. The method includes performing a table-based refresh operation on at least a first word line of the plurality of word lines in a first time period of a refresh cycle, and performing a detector-based refresh operation on at least a second word line of the plurality of word lines in a second time period of the refresh cycle. The first word line includes at least one memory cell predetermined to be a weak cell. The second word line includes at least one memory cell dynamically determined to be a weak cell.

An example embodiment of the present disclosure is directed to a memory device. The memory device includes a first circuit, a second circuit and a refresh scheduler. The first circuit is configured to store a first row address of a static weak row, and transmit the first row address. The second circuit is configured to detect a dynamic weak row and transmit a second row address of the dynamic weak row. The refresh scheduler is configured to schedule a refresh operation of the memory device based on the first and second row addresses. The static weak row includes at least one memory cell predetermined to be a weak cell. The dynamic weak row includes at least one memory cell dynamically determined to be a weak cell.

According to an example embodiment, a method of performing a refresh operation of a memory device including a plurality of memory cells connected to a plurality of word lines is provided. The method includes performing a counter-based refresh operation on a first set of word lines of the plurality of word lines during a refresh cycle, and additionally performing a detector-based refresh operation on at least a first word line of the first set of word lines during the refresh cycle. The first word line includes at least one memory cell dynamically determined to be a weak cell.

BRIEF DESCRIPTION OF THE DRAWINGS

Exemplary embodiments will be more clearly understood from the following detailed description taken in conjunction with the accompanying drawings in which.

DETAILED DESCRIPTIONS OF THE EMBODIMENTS

Figure 1:
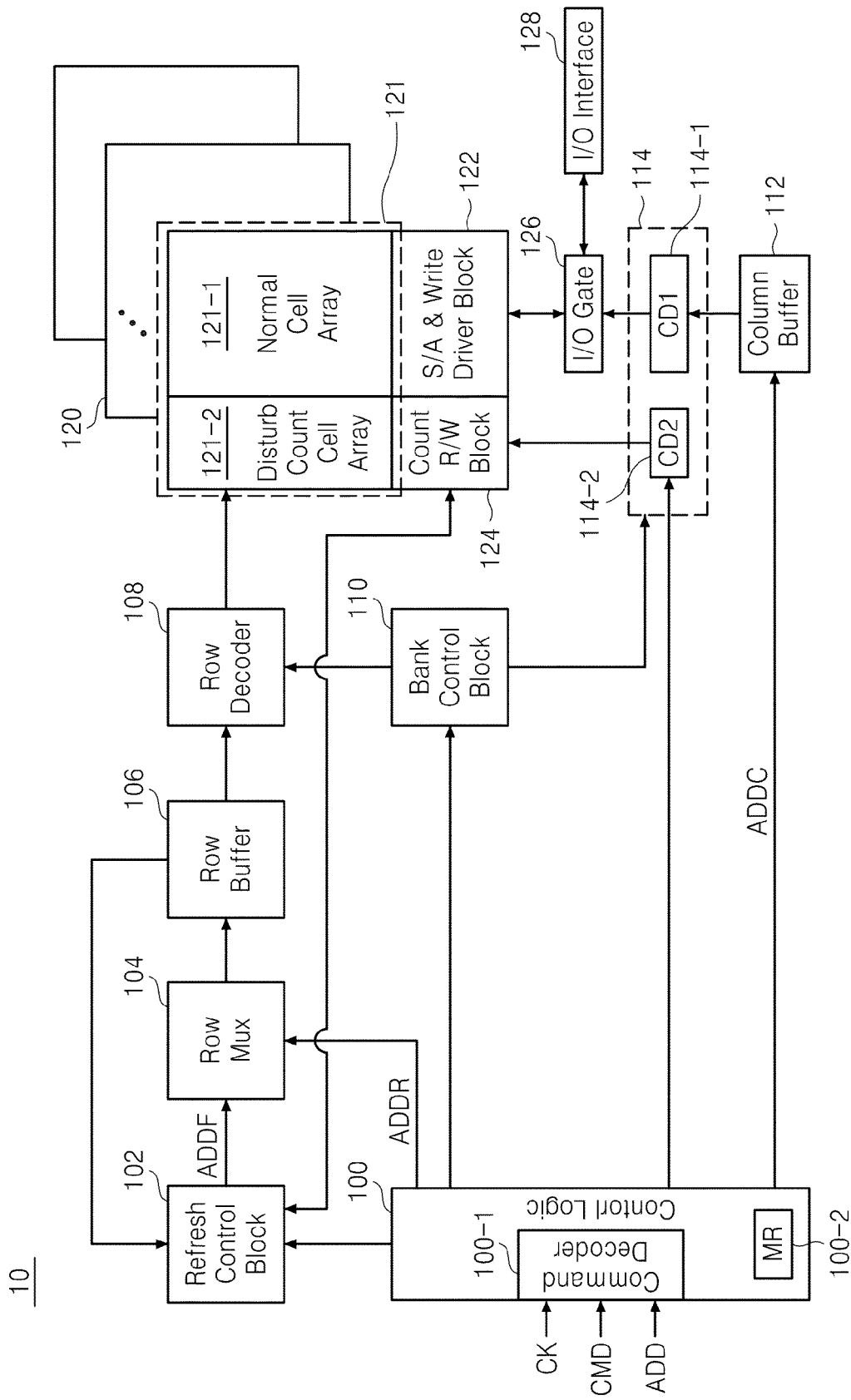
FIG. 1 is a block diagram of a memory device according to an exemplary embodiment.

Various exemplary embodiments will be described more fully with reference to the accompanying drawings, in which exemplary embodiments are shown. The disclosure may, however, be embodied in many different forms and should not be construed as being limited to the embodiments set forth herein. In the drawings, the thicknesses of layers and regions are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/"

It will be understood that, although the terms first, second, etc. may be used herein to describe various elements, these elements should not be limited by these terms unless the context indicates otherwise. Unless indicated otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A static weak cell in the present disclosure may denote a memory cell having short retention time relatively, in comparison with other memory cells, and a static weak row may denote a row line including the memory cell (e.g., a plurality of memory cells including the memory cell and connected to a word line).

A dynamic weak cell in the present disclosure may denote a memory cell having retention time reduced by disturbance or interference of an adjacent cell, and a dynamic weak row denote a row line including the memory cell (e.g., a plurality of memory cells including the memory cell and connected to a word line). Thus, the retention time of the dynamic weak cell may change during operation of the memory device.

FIG. 1 is a block diagram of a memory device according to an example embodiment.

Referring to FIG. 1, a memory device 10 may include a control logic 100, a refresh control block 102, a row multiplexer 104, a row buffer 106, a row decoder 108, a bank control logic 110, a column buffer 112, a column decoder 114, a plurality of banks 120, an input/output gate 126, and an input/output (I/O) interface 128.

The control logic 100 may control each component, e.g., the refresh control block 102, the row multiplexer 104, the bank control logic 110, the column buffer 112, or the column decoder 114, in response to a plurality of signals, e.g., a clock signal CK, a command signal CMD, and an address signal ADD.

The command signal CMD may denote a combination of a plurality of commands, e.g., CS, RAS, CAS, and/or WE. According to an example embodiment, the command signal CMD and the address signal ADD may be transmitted from a memory controller (not shown) controlling the memory device 10.

The control logic 100 may include a command decoder 100-1 and a mode register 100-2. According to an example embodiment, a command decoder 100-1 and/or a mode register 100-2 may be separately embodied outside the control logic 100.

The command decoder 100-1 may decode a command signal CMD configured by a combination of the plurality of signals, e.g., CS, RAS, CAS, and/or WE, and generate a command for controlling each component, e.g., the refresh control block 102, the row multiplexer 104, the bank control logic 110, the column buffer 112, or the column decoder 114, according to a result of the decoding.

According to an example embodiment, the command decoder 100-1 may decode the command signal CMD and generate a command for performing each type of operation, e.g., a read operation, a write operation, or a refresh operation.

The mode register 100-2 stores data for controlling various operation modes of the memory device 10. According to an example embodiment, the mode register 100-2 may store data related to memory latency of the memory device 100 and/or data related to an operation frequency.

The refresh control block 102 may control a refresh operation of the memory device 10. The refresh control block 102 may transmit a row address ADDF of a row which is designated for the refresh operation to the row multiplexer 104. The refresh control block 102 will be described in more detail referring to FIG. 2.

The row multiplexer 104 may select one of a row address ADDF generated by the refresh control block 102 and a row address ADDR output from the control logic 100 in response to a selection signal (not shown).

According to an example embodiment, when performing the refresh operation, the row multiplexer 104 may select the row address ADDF generated by the refresh control block 102. According to another example embodiment, when performing a normal memory access operation, e.g., a read operation or a write operation, the row multiplexer 104 may select the row address ADDR output from the control logic 100.

The row buffer 106 may buffer a row address output from the row multiplexer 104. For convenience of description, the row buffer 106 is illustrated as one block; however, the row buffer 106 may be embodied in a plurality of row buffers, and is not restricted thereto.

The row decoder 108 may decode a row address output from the row buffer 106. For convenience of description, the row decoder 108 is illustrated as one block; however, the row decoder 108 may be embodied in a plurality of row decoders, and is not restricted thereto. The bank control block 110 may select at least one of a plurality of banks 120 according to a control of the control logic 100.

The column buffer 112 may buffer a column address ADDC output from the control logic 100. For convenience of description, the column buffer 112 is illustrated as one block; however, the column buffer 112 may be embodied in a plurality of column buffers, and is not restricted thereto.

The column decoder 114 may include a first column decoder 114-1 and a second column decoder 114-2. The first column decoder 114-1 may receive a column address related to a normal cell array 121-1 from the column buffer 112, and decode the received column address. The second column decoder 114-2 may control an operation timing of the count read/write block 124, or supply address information of a memory cell to update among memory cells included in a disturb count cell array 121-2 to the count read/write block 124.

According to an example embodiment, the second column decoder 114-2 may receive information regarding a row active timing and/or information regarding tRCD (RAS to CAS delay time) from the control logic 100 in order to control a read operation timing of the count read/write block 124. The read operation timing of the count read/write block 124 will be described in detail referring to FIG. 7.

Each of the plurality of banks 120 may include a memory cell array 121, a sense amplifier & write driver block 122, and a count read/write block 124.

For convenience of description, it is illustrated that each of the plurality of banks 120 is embodied in a different layer; however, the scope of the present inventive concepts should not be limitedly interpreted by a configuration and layout of the plurality of banks 120.

The memory cell array 121 may include a normal cell array 121-1 and a disturb count cell array 121-2.

The normal cell array 121-1 includes a plurality of word lines or row lines, a plurality of bit lines or column lines, and a plurality of memory cells for storing data. When a memory access is intensively performed on a particular row line among the row lines included in the normal cell array 121-1, the row line may disturb data retention of row lines adjacent to the row line.

The disturb count cell array 121-2 may include memory cells for storing the disturb number, e.g., a memory access number.

The sense amplifiers & write driver block 122 may operate as a sense amplifier sensing and amplifying a change in voltage of each bit line included in the normal memory cell array 121-1 when the memory device 10 performs a read operation. The sense amplifiers & write driver block 122 may operate as a write driver which may drive each of a plurality of bit lines included in the normal memory cell array 121-1 when the memory device 10 performs a write operation.

The count read/write block 124 may read data stored in memory cells included in the disturb count cell array 121-2, count the memory access number for a particular row using the read data, and write again the counted memory access number in the memory cells. The count read/write block 124 will be described in detail referring to FIG. 5.

The input/output gate 126 may transmit data signals output from the sense amplifiers & write driver block 122 to the input/output interface 128 in response to a column selection signal output from the first column decoder 114-1.

According to an example embodiment, the input/output gate 126 may transmit data signals input through the input/output interface 128 to the sense amplifiers & write driver block 122 in response to the column selection signal.

According to an example embodiment, the input/output gate 126 may be included in the input/output interface 128. The input/output interface 128 may interface data input/output between the memory device 10 and external devices.

Figure 2:
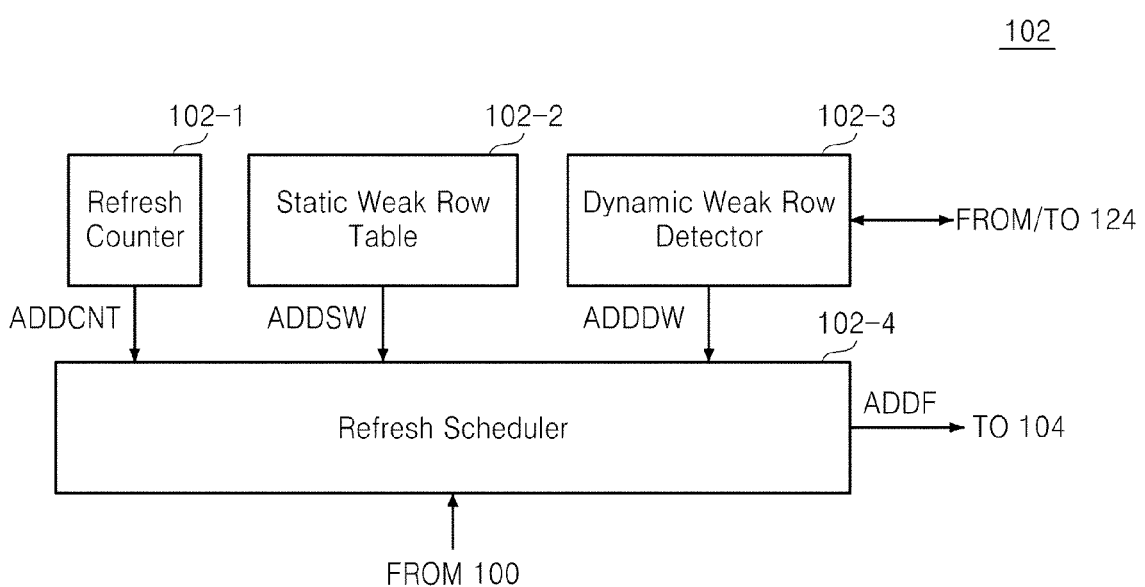
FIG. 2 is an exemplary block diagram of a refresh control block illustrated in FIG. 1.

FIG. 2 is an exemplary block diagram of the refresh control block illustrated in FIG. 1. Referring to FIGS. 1 and 2, the refresh control block 102 may include a refresh counter 102-1, a static weak row table 102-2, a dynamic weak row detector 102-3, and a refresh scheduler 102-4.

The refresh counter 102-1 may supply a row address ADDCNT of a row which is designated for a regular refresh operation periodically performed to the refresh scheduler 102-4.

The static weak row table 102-2 may supply a row address ADDSW of the static weak row to the refresh scheduler 102-4 so as to perform a refresh operation on a static weak row. According to an example embodiment, depending on length of retention time of each of memory cells, a frequency at which each row address of the memory cells is recorded per unit space of the static weak row table 102-2 may be differentiated.

For example, a row address of a memory cell having length of retention time of 64 ms may be recorded once every 4k lines of the static weak row table 102-2, and a row address of a memory cell having length of retention time of 32 ms may be recorded once every 2k lines of the static weak row table 102-2.

For example, as the retention time of a memory cell gets shorter, a frequency at which a row address of the static weak row including the memory cell is recorded in the static weak row table 102-2 gets increased. Accordingly, a refresh cycle of the static weak row may be decreased.

The dynamic weak row detector 102-3 may detect a dynamic weak row and transmit an address ADDDW of the detected dynamic weak row to the refresh scheduler 102-4. The dynamic weak row detector 102-3 will be described in detail referring to FIG. 5.

The refresh scheduler 102-4 may select one of the row address ADDCNT transmitted from the refresh counter 102-1, the row address ADDSW transmitted from the static weak row table 102-2, and the row address ADDDW transmitted from the dynamic weak row detector 102-3, and transmit the selected row address ADDF to the row multiplexer 104.

For example, the refresh scheduler 102-4 may schedule a refresh operation so that one of a regular refresh using the refresh counter 102-1 (i.e., a counter-based refresh), a table-based refresh using the static weak row table 102-2, and a detector-based refresh using the dynamic weak row detector 102-3 may be performed.

According to an example embodiment, the refresh scheduler 102-4 may schedule the refresh operation according to a control of the control logic 100.

Figure 3:
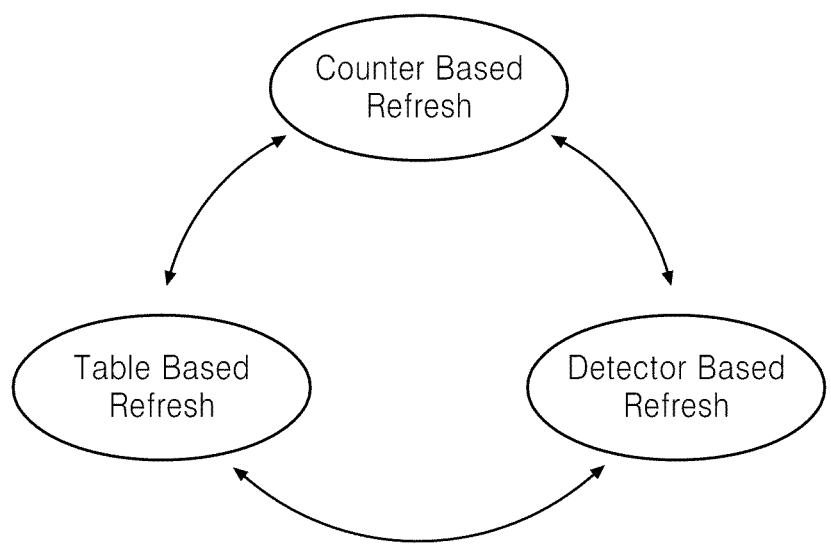
FIG. 3 is a conceptual diagram for describing a refresh control method according to an example embodiment of the refresh control block illustrated in FIG. 2.
Figure 4:
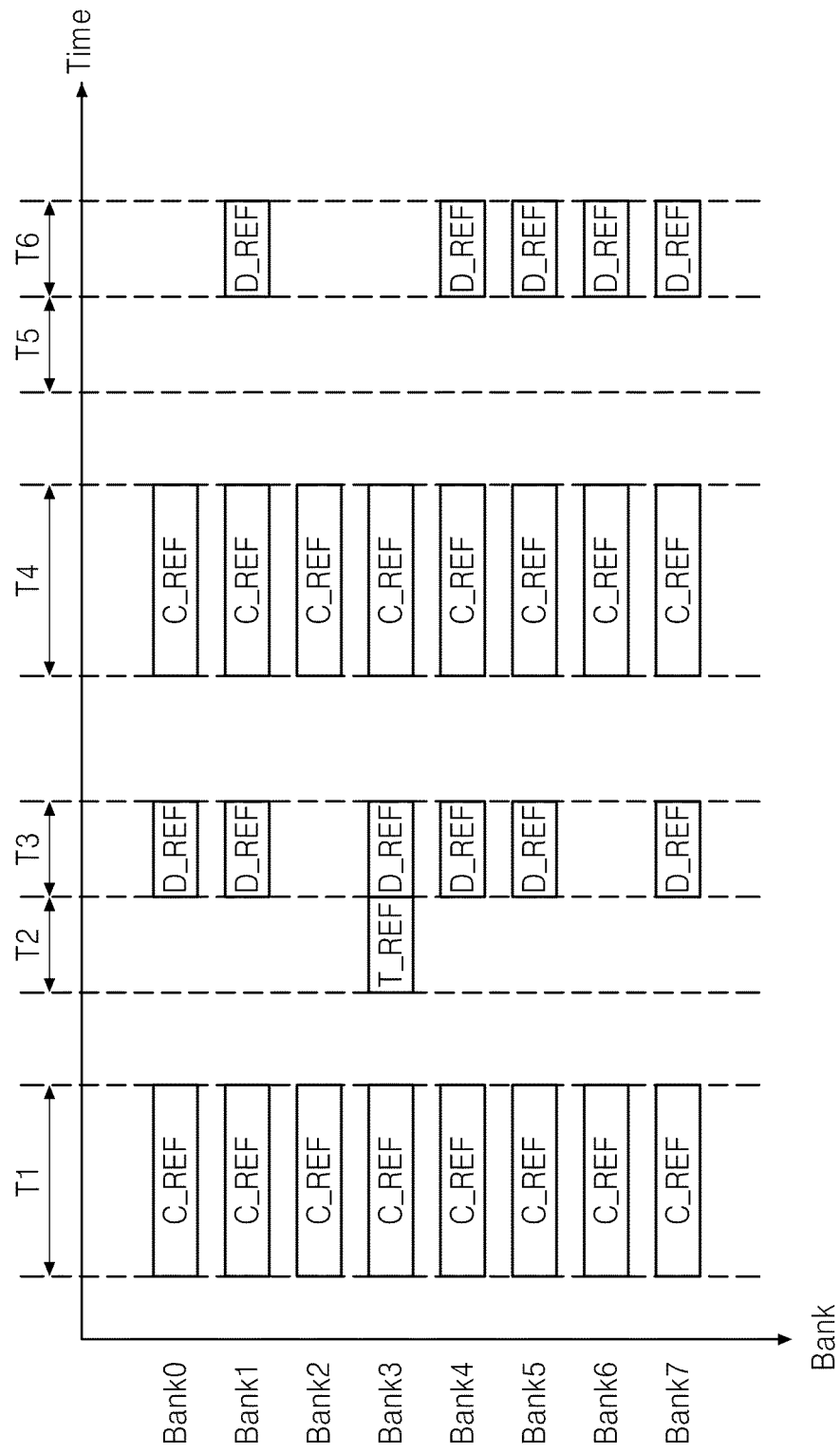
FIG. 4 is a timing diagram for describing the refresh control method according to an example embodiment of the refresh control block illustrated in FIG. 2.

FIG. 3 is a conceptual diagram for describing a refresh control method according to an example embodiment of the refresh control block illustrated in FIG. 2. FIG. 4 is a timing diagram for describing the refresh control method according to an example embodiment of the refresh control block illustrated in FIG. 2.

Referring to FIGS. 1 to 3, the counter-based refresh may denote a regular refresh using a row address ADDCNT output from the refresh counter 102-1.

The table-based refresh may denote a refresh using the row address ADDSW output from the static weak row table 102-2. For example, at least one memory cell associated with the row address ADDSW may be predetermined as a weak cell (referred to herein as a static weak cell) prior to a memory device operation (e.g., during testing). The row address ADDSW may be stored in the static weak row table 102-2.

The detector-based refresh may denote a refresh using the row address ADDDW output from the dynamic weak row detector 102-3. For example, at least one memory cell associated with the row address ADDDW may be dynamically determined to be a weak cell (referred to herein as a dynamic weak cell), for example based on an operation of the memory device.

The counter-based refresh, the table-based refresh, or the detector-based refresh may be alternately performed by the refresh scheduler 102-4 included in the refresh control block 102.

Referring to FIGS. 1 to 4, each bank Bank0 to Bank7 may periodically perform the counter-based refresh C_REF in a first period T1 and a fourth period T4.

For example, in a second period T2, a bank Bank3 may perform the table-based refresh T_REF. A table-based refresh T_REF may denote a refresh for a static weak row included in the bank Bank3. In a third period T3, banks Bank0, Bank1, Bank3, Bank4, Bank5, and Bank7 where a dynamic weak row is detected may perform a detector-based refresh D_REF.

A fifth period T5 may denote a period where there is no address of a static weak row recorded on the static weak row table 102-2. In a sixth period T6, banks Bank1, Bank4, Bank5, Bank6, and Bank7 where a dynamic weak row is detected may perform the detector-based refresh D_REF in the same manner as used in the third period T3.

In one embodiment, a row active operation of the memory device may occur between the first period T1 and the second period T2, between the third period T3 and the fourth period T4, and between the fourth period T4 and the fifth period T5.

Figure 5:
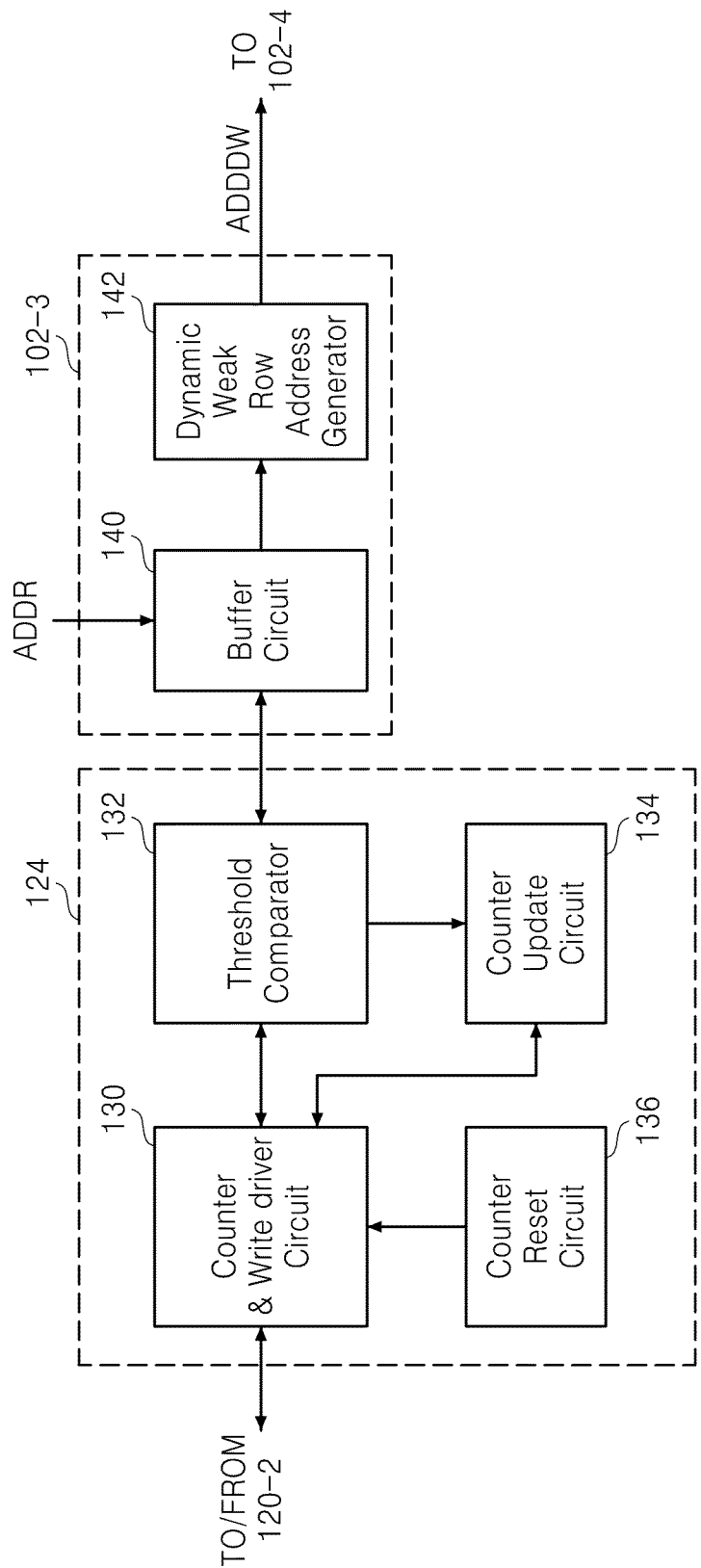
FIG. 5 is a block diagram according to an example embodiment of a count read/write block illustrated in FIG. 1 and a dynamic weak row detector illustrated in FIG. 2.

FIG. 5 is a block diagram according to an example embodiment of the count read/write block illustrated in FIG. 1 and the dynamic weak row detector illustrated in FIG. 2. Referring to FIGS. 1 and 5, the count read/write block 124 may include a counter & write driver circuit 130, a threshold comparator 132, a counter update circuit 134, and a counter reset circuit 136.

The counter & write driver circuit 130 may include a plurality of counters (not shown) for reading data stored in a memory cell included in the disturb count cell array 121-2 and counting a disturb number (e.g., access number). For example, the counter & write driver circuit 130 may include a carry look ahead counter or a ripple carry counter, however, it is not restricted thereto.

According to an example embodiment, the counter & write driver circuit 130 may operate as a write driver for writing the count value updated by the counter update circuit 134 into a memory cell included in the disturb count cell array 120-2.

The threshold comparator 132 may compare the disturb number transmitted from the counter & write driver circuit 130 and a threshold value (e.g., reference value), and determine to perform a refresh on the designated word line if the disturb number exceeds the threshold value. According to an example embodiment, the threshold comparator 132 may monitor a state of the buffer circuit 140.

The counter update circuit 134 may update a disturb number stored in counters (not shown) included in the counter & write driver circuit 130 when the disturb number is less than the threshold value according to a result of the comparison of the threshold comparator 132. For example, the counter update circuit 134 may be embodied in a carry generator generating a carry for the update. For example, when the disturb number is less than the threshold value, a disturb number stored in counters (not shown) included in the counter & write driver circuit 130 may be increased by one time.

A disturb number stored in the counter & write driver circuit 130 is updated by a carry transmitted from the counter update 134, and the counter & write driver circuit 130 may write the updated disturb number in the disturb count cell array 120-2.

The counter reset circuit 136 may reset the disturb number stored in the counter (not shown) included in the counter & write driver circuit 130. According to an example embodiment, when the disturb number of a particular row exceeds the threshold value and the detector-based refresh is performed on rows adjacent to the particular row, the counter reset circuit 136 may reset the counters (not shown).

According to another example embodiment, the counter reset circuit 136, when a regular refresh, i.e., the counter-based refresh, is performed on a particular row, may reset the disturb number related to the particular row.

According to still another example embodiment, the counter reset circuit 136, when a row address ADDR of a row whose disturb number exceeds the threshold value is stored in the buffer circuit 140, may reset the disturb number stored in the counters (not shown) included in the counter & write driver circuit 130.

The dynamic weak row detector 102-3 may include the buffer circuit 140 and a dynamic weak row address generator 142.

The buffer circuit 140 may buffer the row address ADDR of a row whose disturb number exceeds the threshold value according to a comparison result of the threshold comparator 132, and transmit the buffered row address to the dynamic weak row address generator 142.

According to an example embodiment, the buffer circuit 140 may receive the row address ADDR from the control logic 100. According to another example embodiment, the dynamic weak row detector 102-3 may not include the buffer circuit 140, and in this case the row address ADDR may be directly transmitted to the dynamic weak row address generator 142.

The dynamic weak row address generator 142 may generate a row address ADDDW of each row adjacent to the row whose disturb number exceeds the threshold value. The generated row address ADDDW may be transmitted to the refresh scheduler 102-4.

Figure 6:
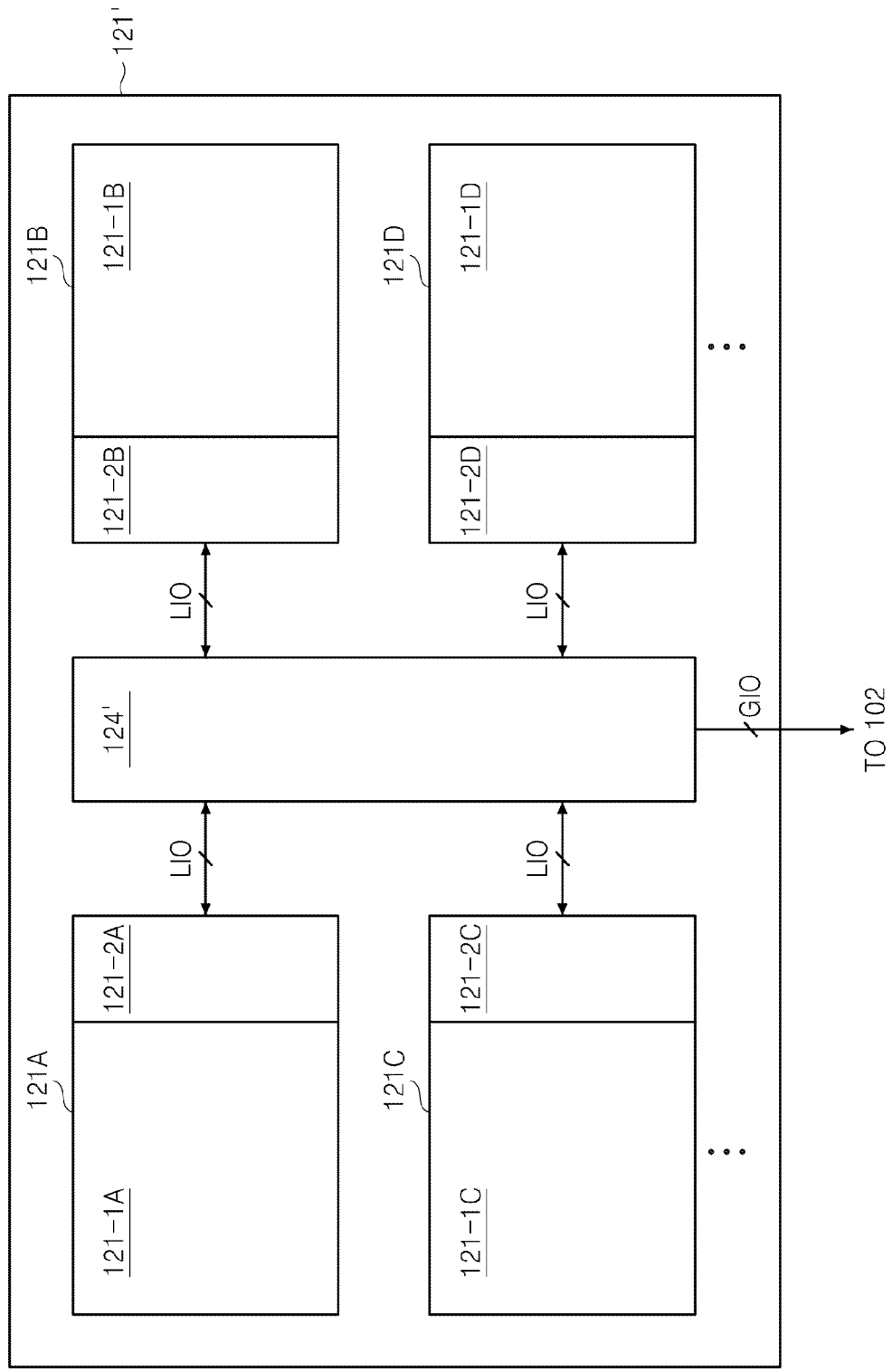
FIG. 6 is a memory cell array including the count read/write block illustrated in FIG. 1 according to an example embodiment.

FIG. 6 is a memory cell array including the count read/write block illustrated in FIG. 1 according to an example embodiment.

Referring to FIGS. 1, 5, and 6, a memory cell array 121' according to another example embodiment of the memory cell array 121 of FIG. 1 may include a first group of memory blocks 121A and 121C, and a second group of memory blocks 121B and 121D. Each of the memory blocks 121A to 121D may include a normal cell array 121-1A to 121-1D and a disturb count cell array 121-2A to 121-2D.

A count read/write block 124' according to an example embodiment of the count read/write block 124 of FIG. 1 may be embodied in the memory cell array 121' as illustrated in FIG. 6.

According to an example embodiment, the count read/write block 124' may be disposed between the first group of memory blocks and the second group of memory blocks. In one embodiment, the count read/write block 124' may be connected to the disturb count cell array 121-2A to 121-2D through a local input/output line (LIO), and may output a count value to the refresh control block 102 through a global input/output line (GIO).

According to another example embodiment, some configurations of the count read/write block 124', e.g., the threshold comparator 132, the counter update circuit 134, and/or the counter reset circuit 136, may be embodied outside the memory cell array 121'.

Figure 7:
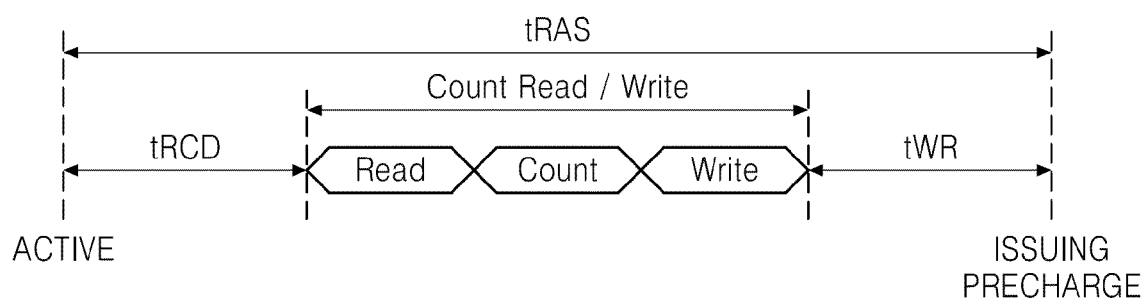
FIG. 7 is a timing diagram for depicting an operation timing of the count read/write block illustrated in FIG. 1 according to an example embodiment.

FIG. 7 is a timing diagram for depicting an operation timing of the count read/write block illustrated in FIG. 1 according to an example embodiment. Referring to FIGS. 1, 5, and 7, a count read/write operation of the count read/write block 124 may be performed in a period except for tRCD (RAS to CAS delay time) and tWR (write recovery time) within tRAS (cycle time).

A read operation included in the count read/write operation may denote an operation of the counter & write driver circuit 130's reading data stored in the memory cells included in the disturb count cell array 121-2. The read operation may be performed after the tRCD (RAS to CAS delay time) is passed from a row active timing.

A count operation included in the count read/write operation may denote an operation of the counter & write driver circuit 130's counting the disturb number using the threshold comparator 132 and the counter update circuit 134. A write operation included in the count read/write operation may denote an operation of the counter & write driver circuit 130's writing the counted disturb number in the memory cells of the disturb count cell array.

Figure 8:
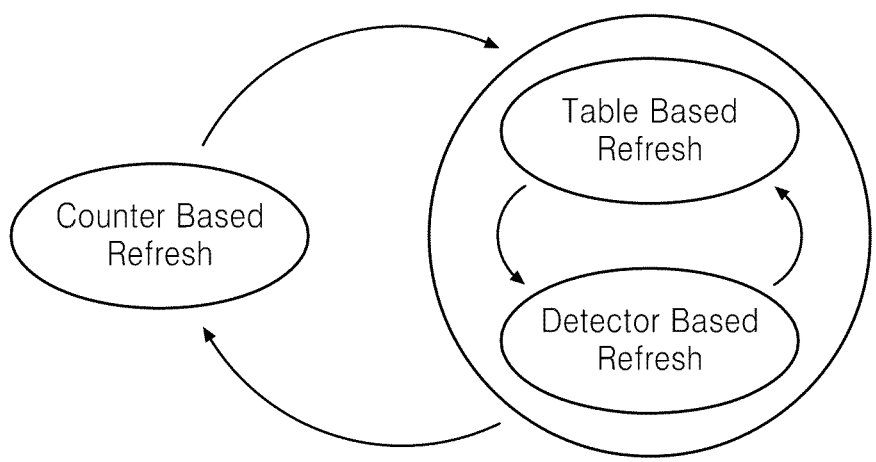
FIG. 8 is a conceptual diagram for describing the refresh control method according to another example embodiment of the refresh control block illustrated in FIG. 2.

FIG. 8 is a conceptual diagram for describing a refresh control method according to another example embodiment of the refresh control block illustrated in FIG. 2. Referring to FIGS. 2 and 8, the refresh control block 102 may alternately perform one of the table-based refresh and the detector-based refresh, and the counter-based refresh. In this case, while the counter-based refresh is performed twice, the table-based refresh and the detector-based refresh may be performed once, respectively.

Figure 9:
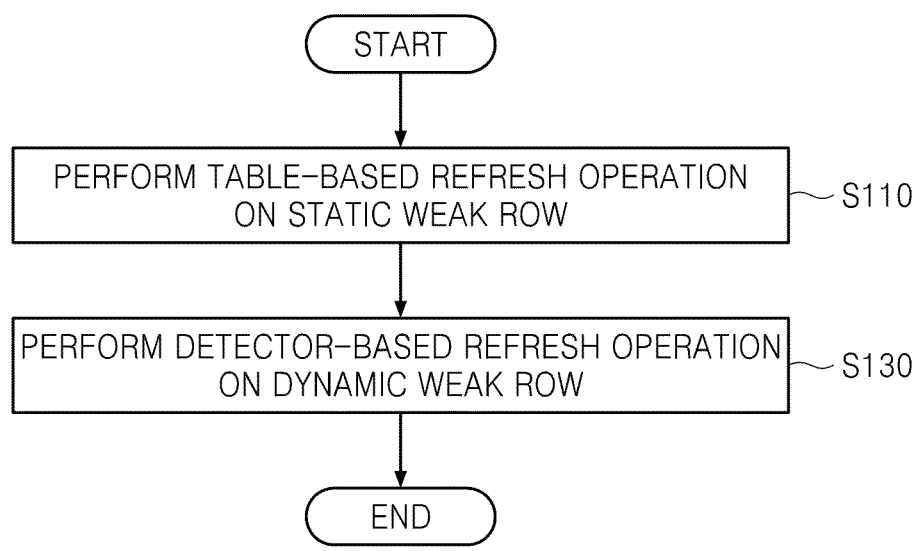
FIG. 9 is a flowchart of a method of performing a refresh operation of the memory device according to an example embodiment.

FIG. 9 is a flowchart of a method of performing the refresh operation of a memory device according to an example embodiment. Referring to FIGS. 1 to 9, the memory device 10 may perform the table-based refresh operation based on an address ADDSW of a static weak row output from the static weak row table 102-2 (S110).

The memory device 10 may perform the detector-based refresh operation based on an address ADDDW of a dynamic weak row output from the dynamic weak row detector 102-3 (S130). According to an example embodiment, S110 and S130 may be changed in sequence. According to another example embodiment, the memory device 10 may perform a regular refresh operation with the table-based refresh operation and the detector-based refresh operation based on the address ADDCNT output from the refresh counter 102-1.

Figure 10:
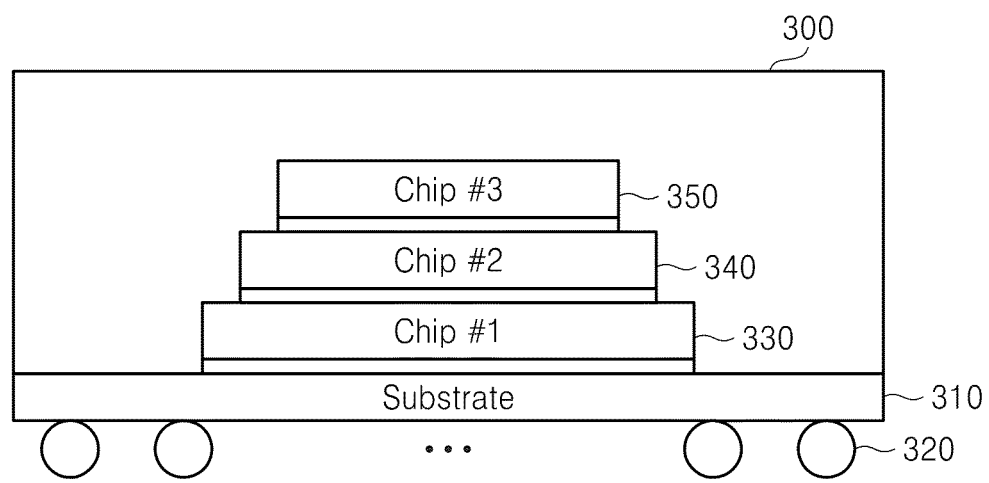
FIG. 10 is a conceptual diagram depicting an example embodiment of a package including the memory device illustrate in FIG. 1.

FIG. 10 is a conceptual diagram depicting an example embodiment of a package including the memory device illustrated in FIG. 1. Referring to FIGS. 1 and 10, a package 300 may include a plurality of semiconductor devices 330, 340, and 350 sequentially stacked on a package substrate 310. Each of the plurality of semiconductor devices 330 to 350 may be the memory device 10.

The package 300 may be embodied in Package On Package (PoP), Ball Grid Arrays (BGAs), Chip Scale Packages (CSPs), Plastic Leaded Chip Carrier (PLCC), Plastic Dual In-Line Package (PDIP), Chip On Board (COB), CERamic Dual In-Line Package (CERDIP), plastic metric quad flat pack (MQFP), Thin Quad Flat Pack (TQFP), small-outline integrated circuit (SOIC), shrink small outline package (SSOP), thin small outline (TSOP), system in package (SIP), multi chip package (MCP), wafer-level package (WLP), or wafer-level processed stack package (WSP).

According to an example embodiment, a memory controller (not shown) may be embodied in one semiconductor device or more among the plurality of semiconductor devices 330 to 350, and may be embodied on the package substrate 310.

For an electrical connection between the plurality of semiconductor devices 330 to 350, electrical vertical connection means, e.g., through-substrate via (TSV, e.g., through-silicon via), may be used.

The package 300 may be embodied in a Hybrid Memory Cube (hereinafter: 'HMC') in a structure where the memory controller and the memory cell array die are stacked each other. By embodying in the HMC, the memory device is improved in performance with an increased bandwidth, and power consumption and manufacturing cost may be reduced by minimizing an area occupied by the memory device.

Figure 11:
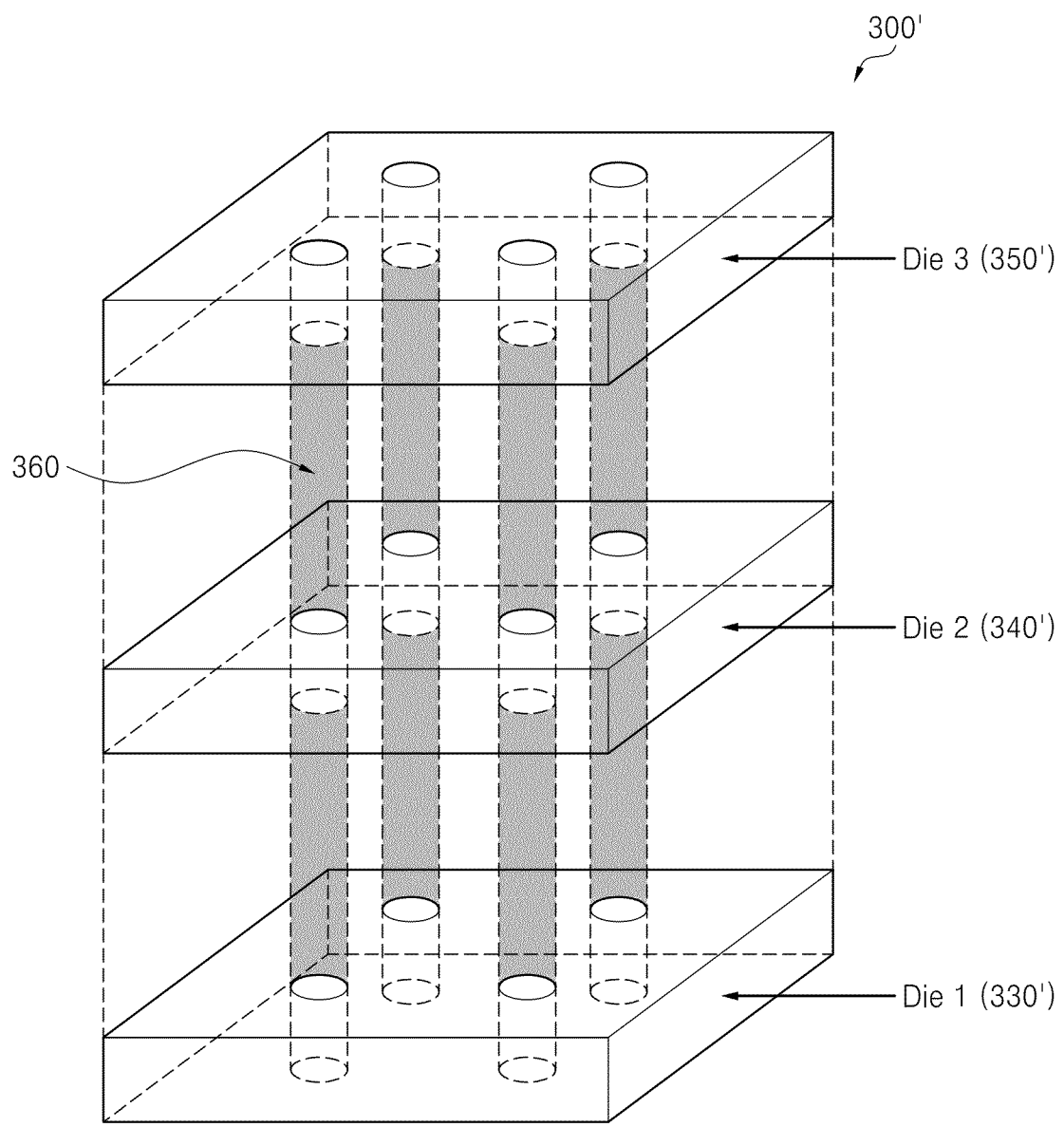
FIG. 11 is a conceptual diagram three-dimensionally depicting an example embodiment of the package including the memory device illustrated in FIG. 1.

FIG. 11 is a conceptual diagram three-dimensionally depicting an example embodiment of a package including the memory device illustrated in FIG. 1. Referring to FIGS. 1, 10, and 11, a package 300' includes a plurality of dies 330' to 350' in a stack structure, which is connected to each other through each TSV 360.

Figure 12:
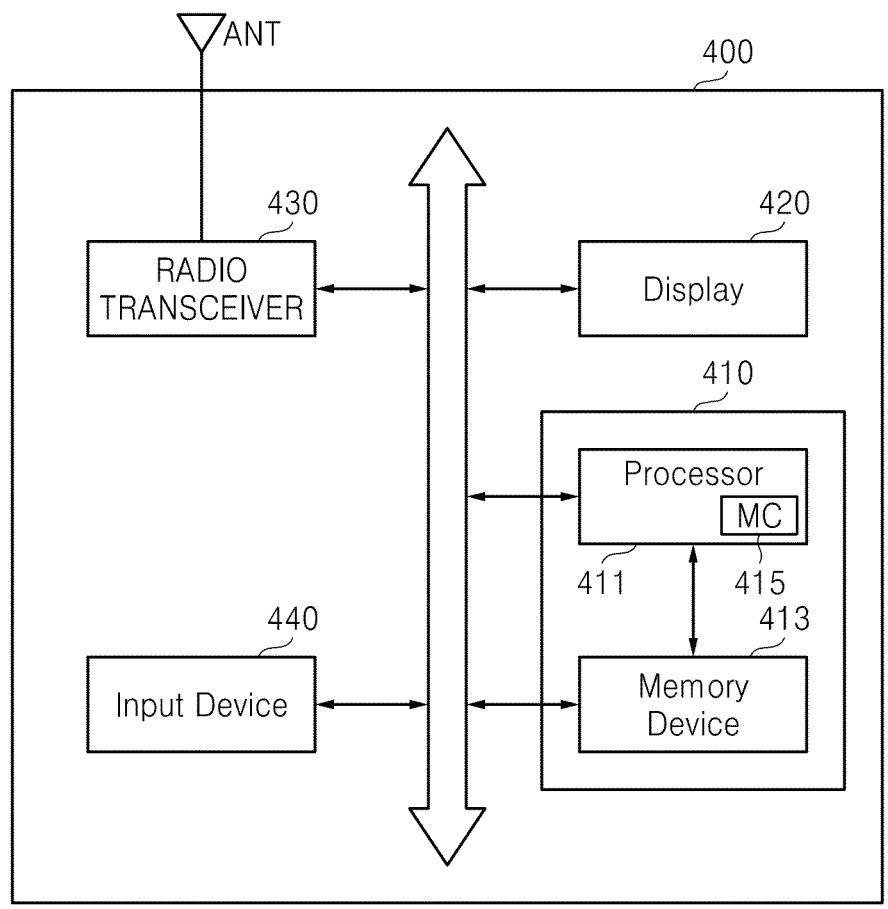
FIG. 12 is a block diagram of an example embodiment of a system including the memory device illustrated in FIG. 1.

FIG. 12 is a block diagram of an example embodiment of a system including the memory device illustrated in FIG. 1. Referring to FIGS. 1, 10 to 12, a system 400 may be embodied in an electronic device or a portable device. In one embodiment, the portable device may be embodied in a cellular phone, a smart phone, or a tablet PC.

The system 400 includes a processor 411 and a memory device 413. The memory device 413 may be the memory device 10 of FIG. 1. According to an example embodiment, the processor 411 and the memory device 413 may be packaged into a package 410. In this case, the package 410 may be mounted on a system board (not shown). The package 410 may denote the package 300 illustrated in FIG. 10 or the package 300' illustrated in FIG. 11.

The processor 411 includes a memory controller 415 controlling a data processing operation of the memory device 413, e.g., a write operation or a read operation. The memory controller 415 is controlled by the processor 411 entirely controlling an operation of the system 400. According to an example embodiment, the memory controller 415 may be connected between the processor 411 and the memory device 413.

Data stored in the memory device 413 may be displayed through a display 420 according to a control of the processor 411.

A radio transceiver 430 may transmit or receive a radio signal through an antenna ANT. For example, the radio transceiver 430 may convert the radio signal received through the antenna ANT into a signal which may be processed by the processor 411. Accordingly, the processor 411 may process a signal output from the radio transceiver 430, and store the processed signal in the memory device 413 or display the signal through the display 420.

The radio transceiver 430 may convert a signal output from the processor 411 into a radio signal, and output the converted radio signal to outside through the antenna ANT. An input device 440 is a device which may input a control signal for controlling an operation of the processor 411 or data to be processed by the processor 411, and may be embodied in a pointing device such as a touch pad and a computer mouse, a keypad, or a keyboard.

The processor 411 may control the display 420 so that data output from the memory device 413, a radio signal output from the radio transceiver 430, or data output from the input device 440 may be displayed through the display 420.

Figure 13:
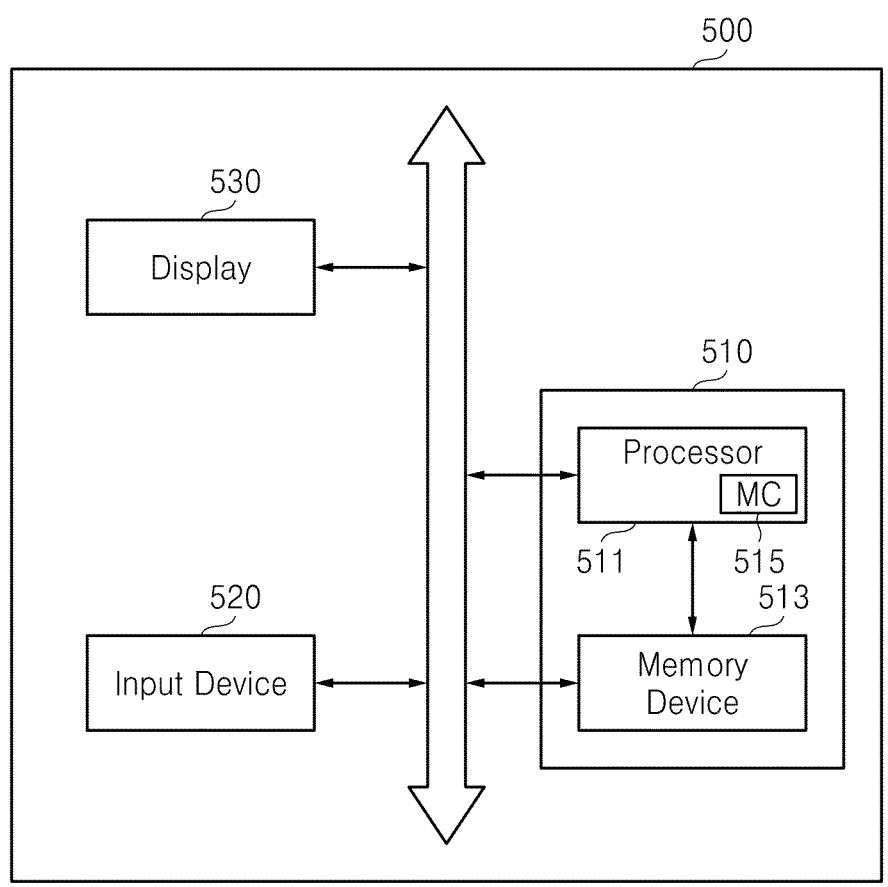
FIG. 13 is a block diagram of another example embodiment of the system including the memory device illustrated in FIG. 1.

FIG. 13 is a block diagram of another example embodiment of the system including the memory device illustrated in FIG. 1. Referring to FIGS. 1, 10, 11, and 13, a system 500 may be embodied in a personal computer (PC), a tablet PC, a net-book, an e-reader, a personal digital assistant (PDA), a portable multimedia player (PMP), a MP3 player, or a MP4 player.

The system 500 may include a processor 511 for entirely controlling an operation of the system 500 and a memory device 513. The memory device 513 may denote the memory device 10 illustrated in FIG. 1.

According to an example embodiment, the processor 511 and the memory device 513 may be packaged into a package 510. The package 510 may be mounted on the system board (not shown). The package 510 may denote the package 300 illustrated in FIG. 10 or the package 300' illustrated in FIG. 11.

The processor 511 may include a memory controller 515 controlling an operation of the memory device 513. The processor 511 may display data stored in the memory device 513 through a display 530 according to an input signal generated by an input device 520. For example, the input device 520 may be embodied in a pointing device such as a touch pad or a computer mouse, a keypad or a keyboard.

Figure 14:
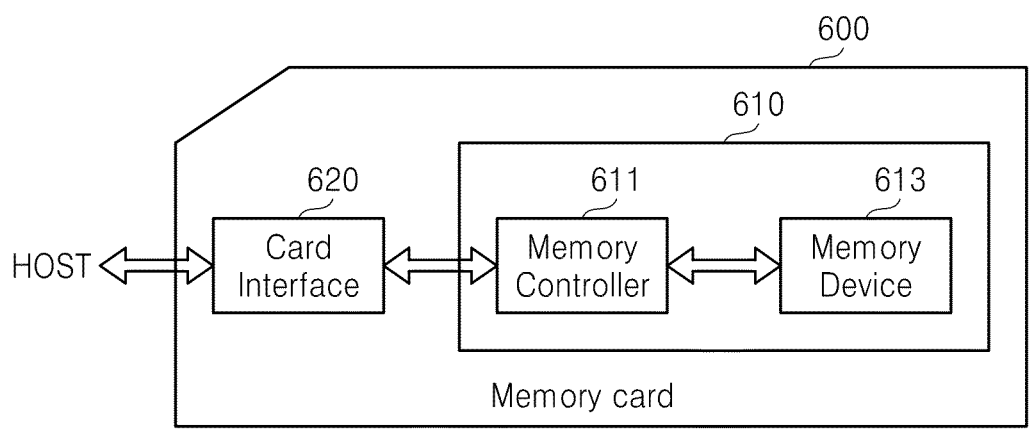
FIG. 14 is a block diagram of still another example embodiment of the system including the memory device illustrated in FIG. 1.

FIG. 14 is a block diagram of still another example embodiment of the system including the memory device illustrated in FIG. 1. Referring to FIGS. 1, 10, 11, and 14, a system 600 may be embodied in a memory card or a smart card.

The system 600 may include a memory device 613, a memory controller 611, and a card interface 610. The memory device 613 may denote the memory device 10 illustrated in FIG. 1. According to an example embodiment, the memory device 613 and the memory controller 611 may be packaged in a package 610. The package 610 may be mounted on the system board (not shown). The package 610 may denote the package 300 illustrated in FIG. 10 or the package 300' illustrated in FIG. 11.

The memory controller 611 may control data exchange between the memory device 613 and the card interface 620. According to an example embodiment, the card interface 620 may be a secure digital (SD) card interface or a multi-media card (MMC) interface; however, it is not restricted thereto. The card interface 620 may interface data exchange between the host and the memory controller 611 according to a protocol of a host.

When the system 600 is connected to a host such as a computer, a digital camera, a digital audio player, a mobile phone, console video game hardware, or a digital set-top box, the host may transmit or receive data stored in the memory device 613 through the card interface 620 and the memory controller 611.

Figure 15:
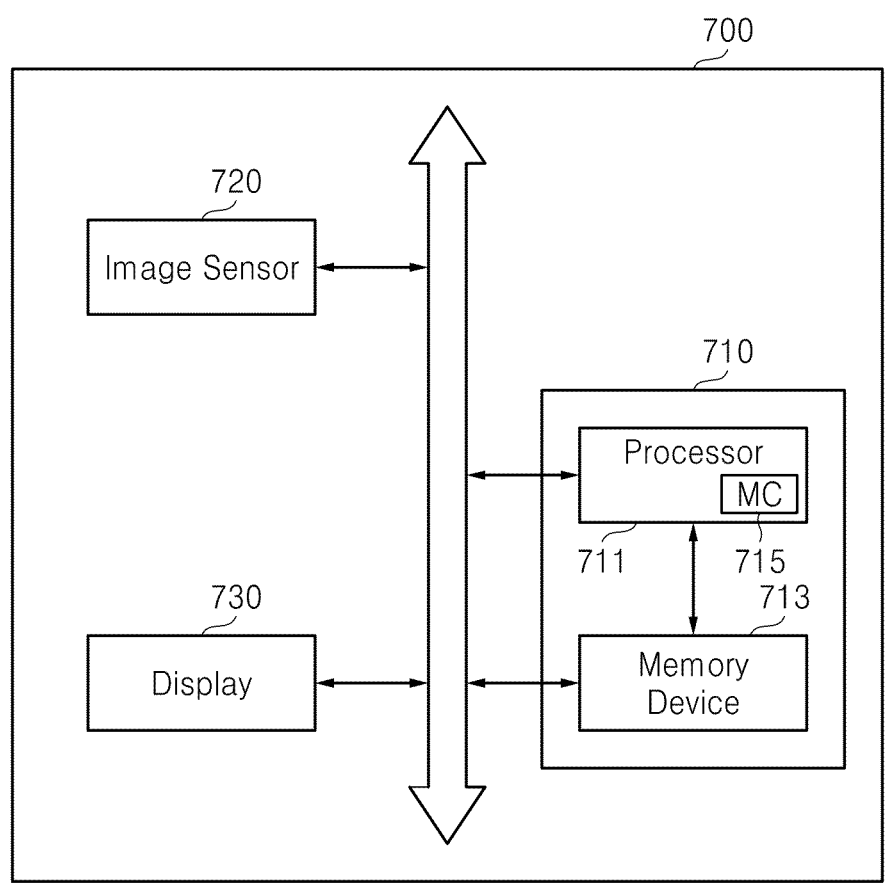
FIG. 15 is a block diagram of still another example embodiment of the system including the memory device illustrated in FIG. 1.

FIG. 15 is a block diagram of still another example embodiment of the system including the memory device illustrated in FIG. 1. Referring to FIGS. 1, 10, 11, and 15, a system 700 may be embodied in a digital camera or a digital camera mounted portable device.

The system 700 may include a processor 711 entirely controlling an operation of the system 700 and a memory device 713. Here, the memory device 713 may denote the memory device 10 illustrated in FIG. 1.

According to an example embodiment, the processor 711 and the memory device 713 may be packaged in a package 710. The package 710 may be mounted on the system board (not shown). The package 710 may denote the package 300 illustrated in FIG. 10 or the package 300' illustrated in FIG. 11.

An image sensor 720 of the system 700 converts an optical image into a digital signal, and the converted digital signal is stored in the memory device 713 or displayed through a display 730 under a control of the processor 711. In addition, the digital signal stored in the memory device 713 is displayed through the display 730 under a control of the processor 711.

Figure 16:
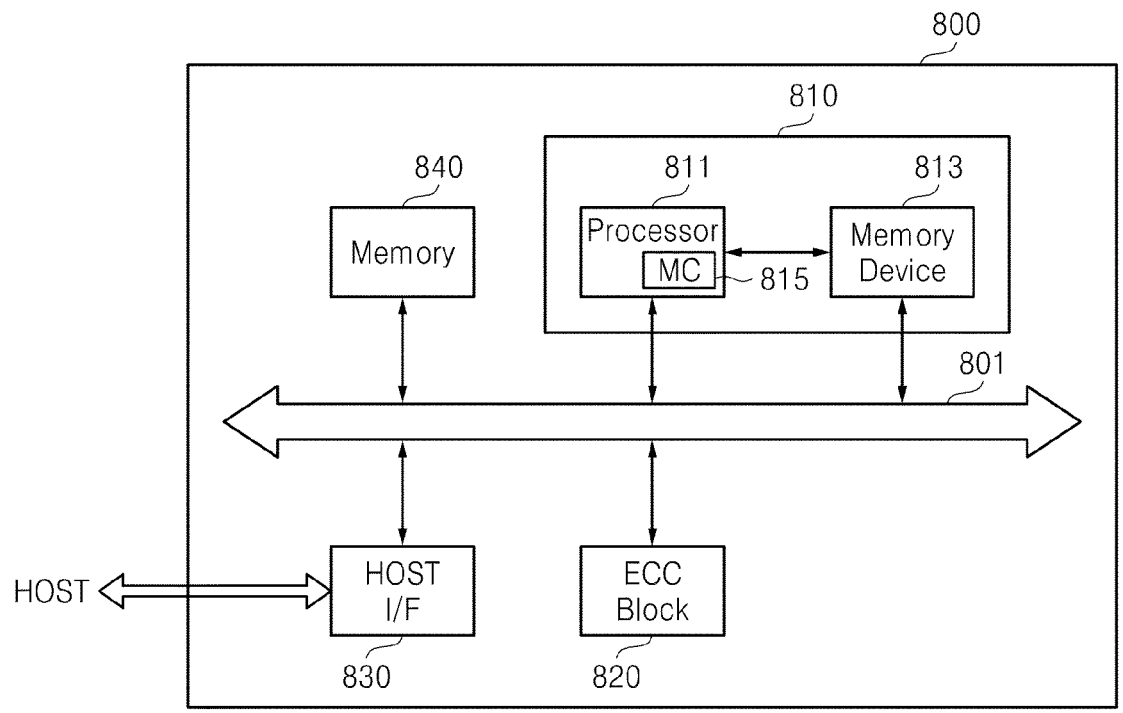
FIG. 16 is a block diagram of still another example embodiment of the system including the memory device illustrated in FIG. 1.

FIG. 16 is a block diagram of still another example embodiment of the system including the memory device illustrated in FIG. 1. Referring to FIGS. 1, 10, 11, and 16, a system 800 includes a memory device 813 and a processor 811 which may entirely control an operation of the system 800. The memory device 813 may denote the memory device 10 illustrated in FIG. 1.

According to an example embodiment, the memory device 813 and the processor 811 may be packaged in a package 810. The package 810 may be mounted on the system board (not illustrated). The package 810 may denote the package 300 illustrated in FIG. 10 or the package 300' illustrated in FIG. 11.

The processor 811 may include a memory controller 815 for controlling an operation of the memory device 813. The system 800 includes a memory 840 which may be used as an operation memory of the processor 811. The memory 840 may be embodied in a non-volatile memory such as read only memory (ROM) or a flash memory.

A host connected to the system 800 transmits or receives data with the memory device 813 through the processor 811 and a host interface 830. Here, the memory controller 815 may perform a function of a memory interface. According to an example embodiment, the system 800 may further include an error correction code (ECC) block 820.

The ECC block 820 operating according to a control of the processor 811 may detect and correct an error included in data read from the memory device 813. The processor 811 may control data exchange among the ECC block 820, the host interface 830, and the memory 840. The system 800 may be embodied in a Universal Serial Bus (USB) memory drive or a memory stick.

Figure 17:
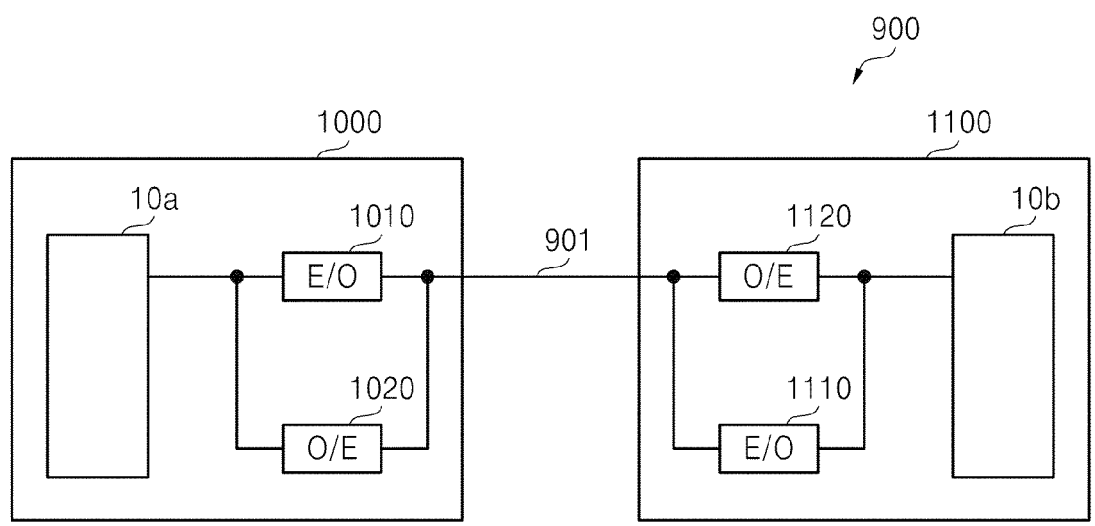
FIG. 17 is a block diagram of still another example embodiment of the system including the memory device illustrated in FIG. 1.

FIG. 17 is a block diagram of still another example embodiment of the system including the memory device illustrated in FIG. 1. A channel 901 may denote optical connection means. The optical connection means may denote a medium transmitting an optical fiber, an optical waveguide, or an optical signal.

Referring to FIGS. 1 and 17, a system 900 may include a first system 1000 and a second system 1100. The first system 1000 may include a first memory device 10a and an electric-photo conversion circuit 1010. The electric-photo conversion circuit 1010 may convert an electrical signal output from the first memory device 10a into an optical signal, and output the converted optical signal to the second system 1100 through the optical connection means 901.

The second system 1100 may include a photo-electric conversion circuit 1120 and a second memory device 10b. The photo-electric conversion circuit 1120 may convert an optical signal input through the optical connection means 901 into an electrical signal, and transmit the converted electrical signal to the second memory device 10b.

The first system 1000 may further include a photo-electric conversion circuit 1020, and the second system 1100 may further include an electric-photo conversion circuit 1110.

When the second system 1100 transmits data to the first system 1000, the photo-electric conversion circuit 1110 may convert an electrical signal output from the second memory device 10b into an optical signal, and output the converted optical signal to the first system 1000 through the optical connection means 901.

The electric-photo conversion circuit 1020 may convert an optical signal input through the optical connection means 901 into an electrical signal, and transmit the converted electrical signal to the first memory device 10a. A structure and an operation of respective memory devices 10a and 10b are substantially the same as a structure and an operation of the memory device 10 of FIG. 1.

A method and a device according to various exemplary embodiments of the disclosure may repair both a static weak row and a dynamic weak row by performing a table-based refresh operation on the static weak row and a detector-based refresh operation on the dynamic weak row. The method and the device of the present disclosure may efficiently use time assigned for a refresh operation.

Although a few embodiments have been shown and described, it will be appreciated by those skilled in the art that changes may be made in these embodiments without departing from the principles and spirit of the general inventive concept, the scope of which is defined in the appended claims and their equivalents.

What is claimed is:

1. A method of performing a refresh operation of a memory device including a plurality of memory cells connected to a plurality of word lines, the method comprising:
   performing a table-based refresh operation on at least a first word line of the plurality of word lines in a first time period of a refresh cycle;
   performing a detector-based refresh operation on at least a second word line of the plurality of word lines in a second time period of the refresh cycle, the second time period not overlapping with the first time period; and
   performing, a counter-based fresh operation in a third time period of the refresh cycle, the third time period not overlapping with the first time period or the second time period,
   wherein the first word line includes at least one memory cell predetermined to be a weak cell,
   wherein the second word line includes at least one memory cell dynamically determined to be a weak cell, and
   wherein the refresh operation of the memory device includes, during the refresh cycle, alternately performing the counter-based refresh operation, the table-based refresh operation, and the detector-based refresh operation.

2. The method of claim 1, wherein the detector-based refresh operation includes determining, during operation of the memory device, to perform refreshing on the second word line.

3. The method of claim 2, wherein the determining includes:
   counting a number of times that a third word line adjacent to the second word line is accessed during the refresh cycle;
   comparing the number of times to a reference number, and
   determining to perform the refreshing on the second word line if the number of times exceeds the reference number.

4. The method of claim 3, wherein a number of times count is reset when the regular refresh operation is performed.

5. The method of claim 3, wherein a number of times count is reset when a row address of the third word line is stored in a buffer circuit.

6. The method of claim 1, wherein the counter-based refresh includes performing a refresh operation on the second word line during the refresh cycle.

7. The method of claim 1, further comprising:
   performing a row active operation of the memory device between the counter-based refresh operation and the table-based refresh operation.

8. The method of claim 1, wherein the refresh operation of the memory device is successively performed the counter-based refresh operation, one of the table-based refresh operation and the detector-based refresh operation, the counter-based refresh operation, and the other of the table-based refresh operation and the detector-based refresh operation in the refresh cycle.

9. A memory device comprising:
   a first circuit configured to store a first row address of a static weak row on which a first refresh operation is performed during a refresh cycle;
   a second circuit configured to detect a dynamic weak row on which a second refresh operation is performed during the refresh cycle; and
   a refresh counter configured to generate a third row address of a row on which a third refresh operation is performed during the refresh cycle; and
   a refresh scheduler configured to schedule a refresh operation of the memory device based on the first through third row addresses,
   wherein the static weak row includes at least one memory cell predetermined to be a weak cell,
   wherein the dynamic weak row includes at least one memory cell dynamically determined to be a weak cell, and
   wherein the refresh operation of the memory device includes, during the refresh cycle, alternately performing the first refresh operation, the second refresh operation, and the third refresh operation.

10. The memory device of claim 9, wherein the refresh scheduler is further configured to schedule a refresh operation of the memory device so as to perform the third refresh operation, one of the first and second refresh operations, the third refresh operation, and the other of the first and second operations.

11. The memory device of claim 9, wherein the second circuit is configured to detect the dynamic weak row based on a number of times that a row adjacent to the dynamic weak row is accessed during a refresh cycle.

12. The memory device of claim 11, further comprising:
   a disturb count cell configured to store the number of times; and
   a count read/write block configured to update the number of times read from the disturb count cell and write the updated number of times into the disturb count cell.

13. The memory device of claim 12, wherein the count read/write block is disposed between memory blocks of the memory device.

14. The memory device of claim 9, further comprising:
   a row decoder configured to generate a row address such that the memory device performs a row active operation between the first or second refresh operation and the third refresh operation.

15. A memory system comprising:
   the memory device of claim 9, and
   a memory controller configured to control the memory device.

16. The memory system of claim 15, further comprising an application processor (AP) configured to process data stored in the memory device.

* * * * *